(12) United States Patent
Lin et al.

(10) Patent No.: US 8,779,517 B2
(45) Date of Patent: Jul. 15, 2014

(54) FINFET-BASED ESD DEVICES AND METHODS FOR FORMING THE SAME

(75) Inventors: Wun-Jie Lin, Hsin-Chu (TW); Ching-Hsiung Lo, Jhubei (TW); Jen-Chou Tseng, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 308 days.

(21) Appl. No.: 13/415,552

(22) Filed: Mar. 8, 2012

(65) Prior Publication Data
US 2013/0234250 A1    Sep. 12, 2013

(51) Int. Cl.
*H01L 23/62* (2006.01)

(52) U.S. Cl.
USPC ........... 257/355; 257/401; 257/506; 257/173; 257/E21.532; 438/197; 438/300

(58) Field of Classification Search
USPC .................. 257/355, 401, 506, 173, E21.532; 438/197, 300
See application file for complete search history.

(56) References Cited

U.S. PATENT DOCUMENTS

| 7,465,995 | B2 | 12/2008 | Chu et al. |
| 2004/0007742 | A1 | 1/2004 | Cheng et al. |
| 2006/0240657 | A1 | 10/2006 | Aiso |
| 2009/0315112 | A1 | 12/2009 | Lee |
| 2011/0298058 | A1 | 12/2011 | Kawasaki et al. |

FOREIGN PATENT DOCUMENTS

| JP | 2011258934 A | 12/2011 |
| KR | 20060111858 A | 10/2006 |

*Primary Examiner* — Sonya D McCall Shepard
(74) *Attorney, Agent, or Firm* — Slater and Matsil, L.L.P.

(57) ABSTRACT

A device includes a plurality of STI regions, a plurality of semiconductor strips between the STI regions and parallel to each other, and a plurality of semiconductor fins over the semiconductor strips. A gate stack is disposed over and crossing the plurality of semiconductor fins. A drain epitaxy semiconductor region is disposed on a side of the gate stack and connected to the plurality of semiconductor fins. The drain epitaxy semiconductor region includes a first portion adjoining the semiconductor fins, wherein the first portion forms a continuous region over and aligned to the plurality of semiconductor strips. The drain epitaxy semiconductor region further includes second portions farther away from the gate stack than the first portion. Each of the second portions is over and aligned to one of the semiconductor strips. The second portions are parallel to each other, and are separated from each other by a dielectric material.

20 Claims, 13 Drawing Sheets

FINFET-BASED ESD DEVICES AND METHODS FOR FORMING THE SAME

BACKGROUND

Extremely high voltages can develop in the vicinity of integrated circuits due to the build-up of static charges. A high potential may be generated to an input buffer or an output buffer of an integrated circuit. The high potential may be caused by a person touching a package pin that is in electrical contact with the input or the output buffer. When the electrostatic charges are discharged, a high current is produced at the package nodes of the integrated circuit. This phenomenon is referred to as ElectroStatic Discharge (ESD). ESD is a serious problem for semiconductor devices since it can potentially destroy the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. Conventionally, bi-directional diode strings were coupled between the package pins to protect the respective circuit. Other ESD devices such as transistors were also used. The ESD devices were also widely used between power lines to protect the internal circuits coupled between the power lines and to discharge ESD currents to the ground.

Fin Field-Effect Transistor (FinFET) structures may be used for forming the ESD devices. To make the process for forming ESD devices compatible with the formation of FinFET structures, FinFETs were connected to construct the ESD protection circuits, wherein the channels of the ESD FinFETs were used to conduct ESD currents. This approach, unfortunately, faces design and process issues. To provide the high ESD protection capability, a great number of FinFET devices, sometimes as many as over 10,000 FinFETs, need to be connected in parallel. This means that the breakdown of any one of these FinFETs may cause the entire ESD protection circuit to malfunction. The FinFETs thus need to be turned on uniformly.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) based ElectroStatic Discharge (ESD) device and the methods of forming the same are provided in accordance with various exemplary embodiments. The intermediate stages of forming the ESD device are illustrated. The variations of the embodiments are discussed. Throughout the various views and illustrative embodiments, like reference numbers are used to designate like elements.

Figure 1:
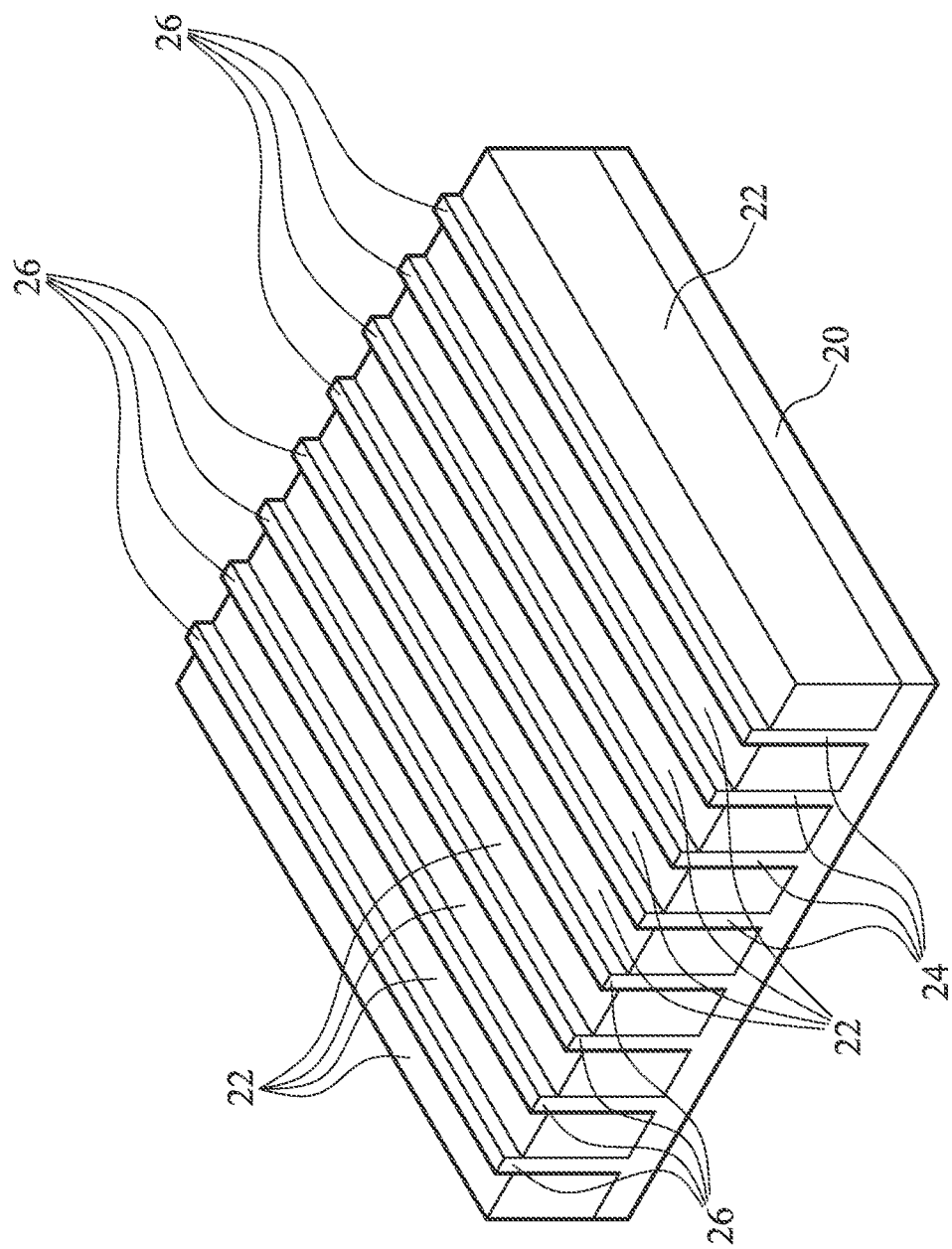
FIGS. 1 through 5F are cross-sectional views, perspective views, and top view of intermediate stages in the manufacturing of an ElectroStatic Discharge (ESD) device in accordance with some exemplary embodiments.

FIGS. 1 through 5F illustrate perspective views, top views, and cross-sectional views of intermediate stages in the formation of the ESD devices in accordance with exemplary embodiments. FIG. 1 illustrates a perspective view of substrate 20. In some embodiments, substrate 20 comprises bulk silicon. Alternatively, substrate 20 comprises bulk silicon germanium (SiGe) or other semiconductor materials. Substrate 20 may be doped with a p-type or an n-type impurity to from a well region, wherein the conductivity type of the well region depends on the types of the resulting FinFET and ESD device.

Shallow Trench Isolation (STI) regions 22 are formed in substrate 20. In some embodiments, STI regions 22 are formed by etching substrate 20 to form recesses, and then filling the recesses with dielectric materials, such as high-density plasma (HDP) oxides, TetraEthyl OrthoSilicate (TEOS) oxides, or the like. A Chemical Mechanical Polish (CMP) is performed to remove excess portions of the dielectric materials, and the remaining portions are STI regions. The portions of substrate 20 between STI regions 22 are referred to as semiconductor strips 24 hereinafter. Next, STI regions 22 are recessed, so that the top surfaces of STI regions 22 are lower than the top surfaces of semiconductor strips 24. The portions of semiconductor strips 24 that are higher than the top surfaces of STI regions 22 thus form semiconductor fins 26.

Figure 2:
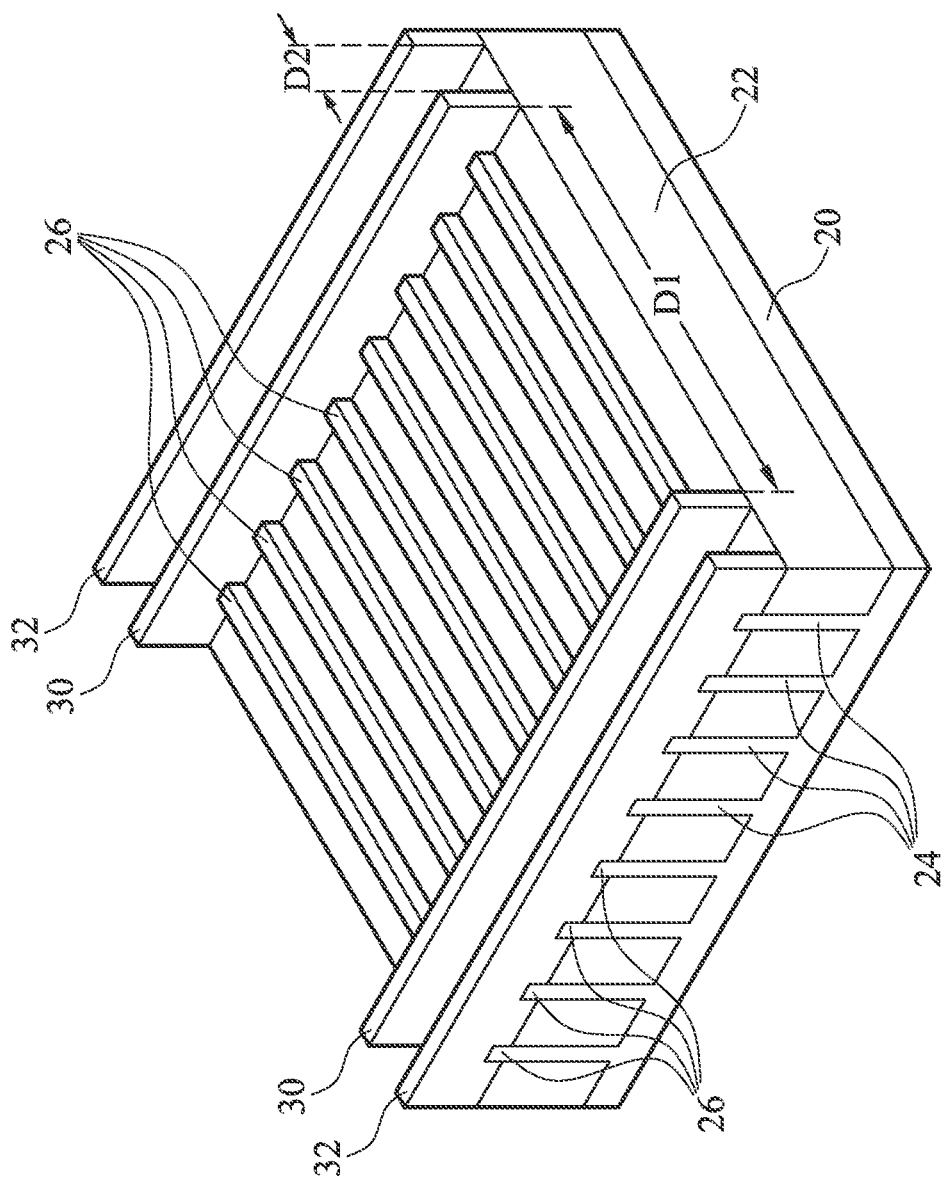

FIG. 2 illustrates the formation of gate stacks 30 and 32, which are parallel to each other. Each of gate stacks 30 and 32 are formed on the sidewalls and the top surfaces of a plurality of semiconductor fins 26. Each of gate stacks 30 and 32 includes gate dielectric 34 and gate electrode 35 (not shown in FIG. 2, please refer to FIG. 4B). Gate dielectrics 34 may include commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, and combinations thereof. Gate electrodes 35 may be formed of polysilicon in accordance with some embodiments. Alternatively, gate electrodes 35 may be formed of other commonly used conductive materials, including metals such as Ni, Ti, Ta, Hf, and combinations thereof, metal silicides such as NiSi, MoSi, HfSi, and combinations thereof, and metal nitrides such as TiN, TaN, HfN, HfAlN, MoN, NiAlN, and combinations thereof.

Referring again to FIG. 2, distance D1 between gate stacks 30 is greater than distance D2, which is the distance from one of gate stack 30 to its neighboring gate stack 32. The ratio D1/D2 may be greater than about 7 in some exemplary embodiments. Distance D1 may also be greater than about 1 μm in some embodiments. It is realized that the dimensions recited throughout the description are merely examples, and may be changed to different values.

Figure 3:
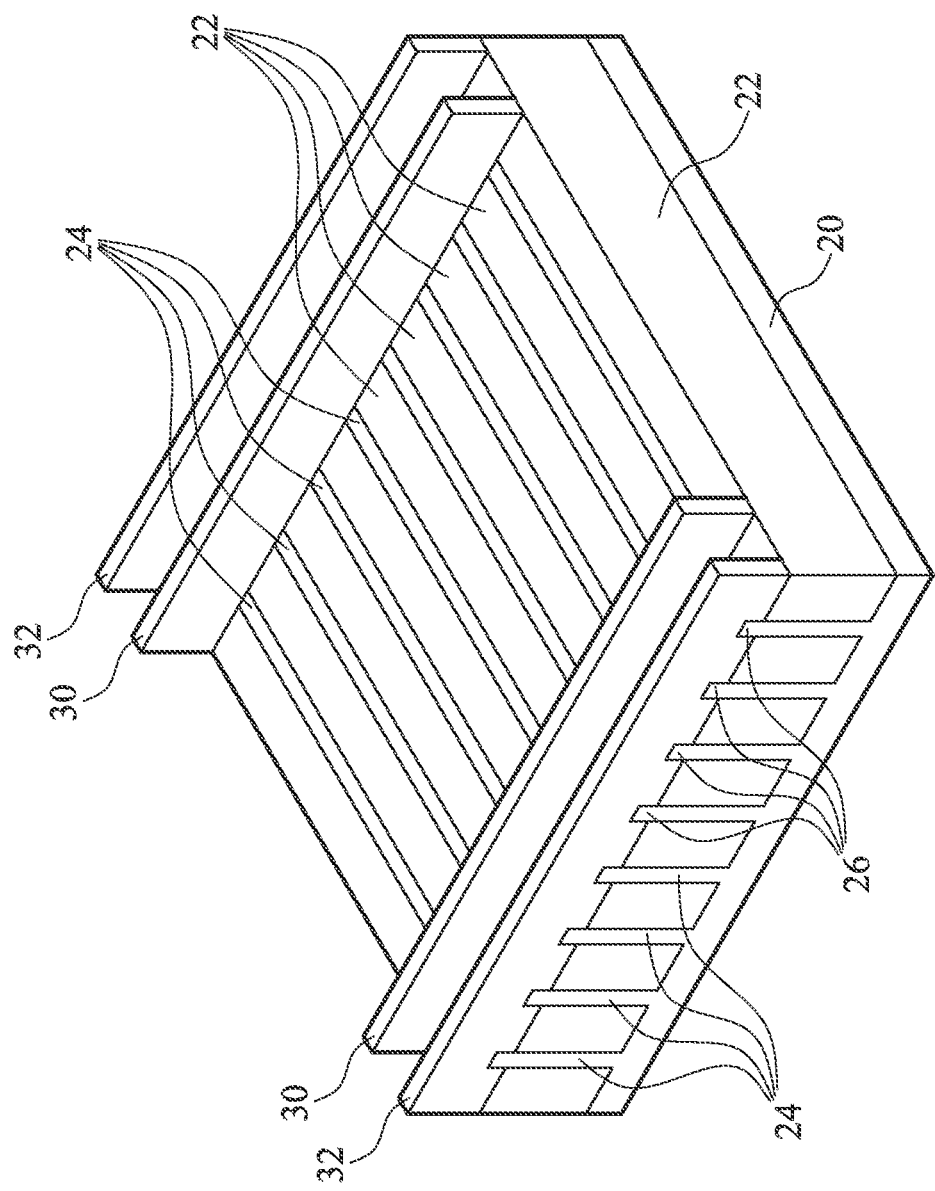

Referring to FIG. 3, the portions of semiconductor fins 26 that are not covered by gate stacks 30 and 32 are etched. The portions of semiconductor fins 26 that are covered by gate stacks 30 and 32 are protected, and are substantially not etched. In some embodiments, substantially entireties of the uncovered portions of semiconductor fins 26 are removed, while semiconductor strips 24 are not etched. In alternative embodiments, the top portions of uncovered portions of semiconductor fins 26 are etched, and the bottom portions of the uncovered portions of semiconductor fins 26 are not etched. In yet alternative embodiments, semiconductor fins 26 are not etched, and the subsequently performed epitaxy are performed on the un-etched semiconductor fins 26.

Figure 4A:
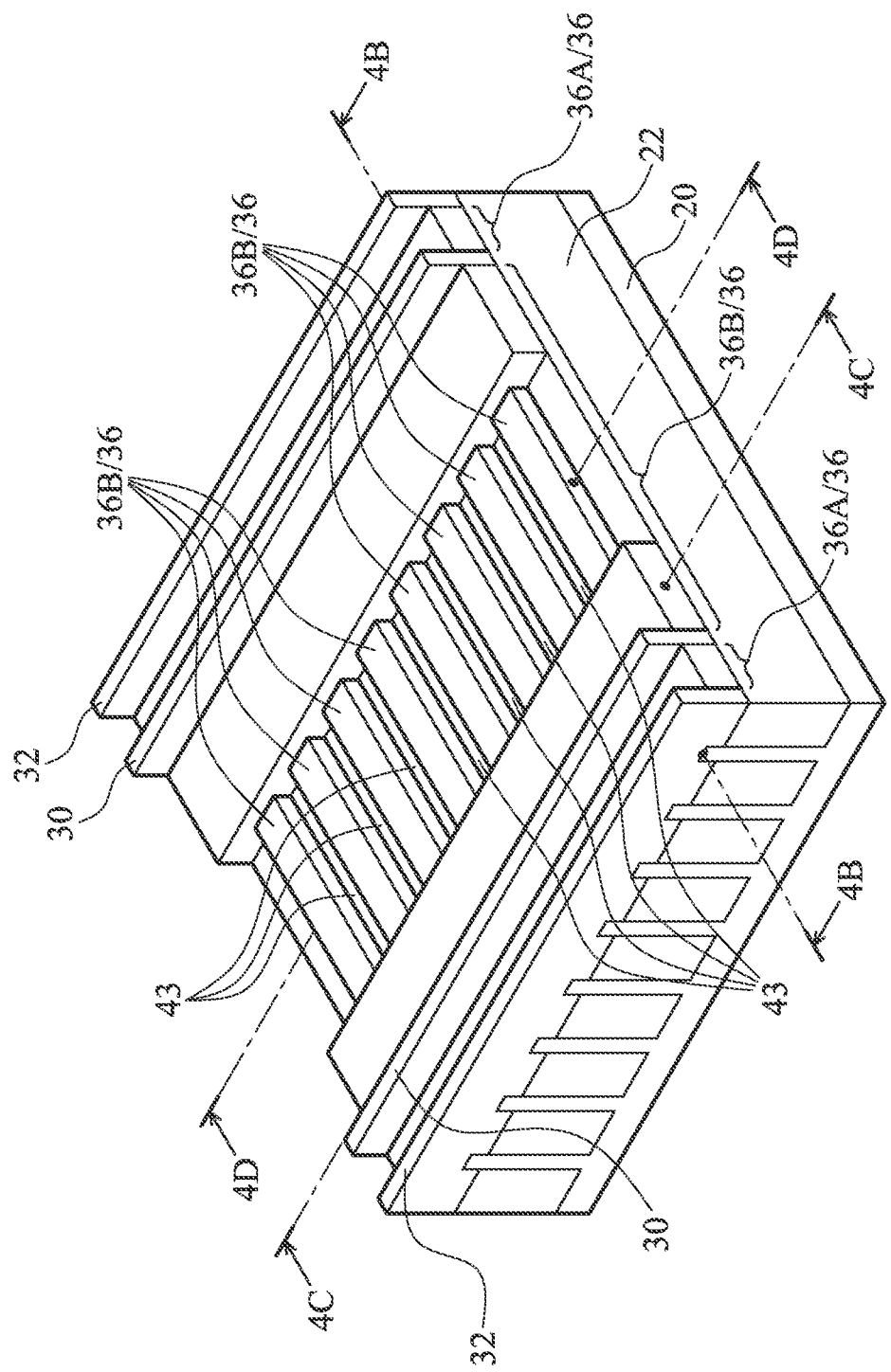

Next, as shown in FIGS. 4A through 4D, a selective epitaxial growth is performed to form epitaxy semiconductor material 36, which are grown from the exposed surfaces of semiconductor fins 26 or semiconductor strips 24. FIG. 4A illustrates a perspective view of the resulting structure. Throughout the description, the portions of semiconductor material 36 between each of gate stacks 30 and it neighboring gate stack 32 are referred to as source epitaxy region 36A. The portion of semiconductor material 36 between gate stacks 30 is referred to as drain epitaxy region 36B. In some embodiments, semiconductor material 36 is formed of the same material as that of substrate 20. In alternative embodiments, semiconductor material 36 is formed of a material different from that of substrate 20. For example, in the embodiments the resulting FinFET is a p-type FinFET, semiconductor material 36 may include silicon germanium (SiGe). Alternatively, in the embodiments the resulting FinFET is an n-type FinFET, semiconductor material 36 may include silicon carbon (SiC).

Figure 4B:
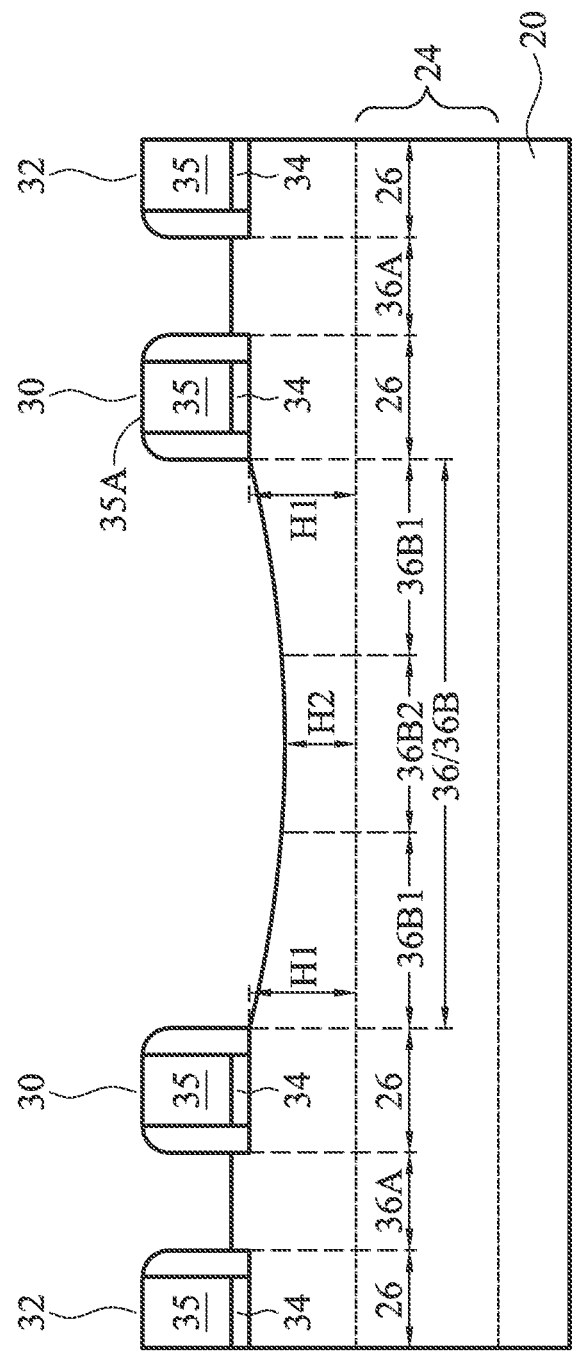

Since distance D1 has a large value, and the chip area occupied by the illustrated device region between gate stacks 30 is relatively large, there is a noticeable difference between the growth rates of different portions of drain epitaxy region 36B. FIG. 4B illustrates a cross-sectional view obtained from the plane crossing line 4B-4B in FIG. 4A. It is noted that although FIG. 4A illustrates that the top surfaces of epitaxy regions 36B have steps, in actual profile, the heights of the top surfaces of epitaxy regions 36B change gradually, as shown in FIG. 4B. Drain epitaxy region 36B may have a top surface having a dishing profile, with the middle portion (which is close to the middle of gate stacks 30) being lower than portions close to gate stacks 30. Alternatively stated, in the cross-sectional view in FIG. 4B, first portions 36B1 of drain epitaxy region 36B have height H1, which is greater than the height H2 of second portion 36B2 of drain epitaxy region 36B. First portions 36B1 are adjacent to gate stacks 30, and second portion 36B2 is at the middle of gate stacks 30. From gate stacks 30 to the middle point of gate stack 30, the top surfaces of epitaxy regions 36B are gradually and continuously lowered.

Figure 4C:
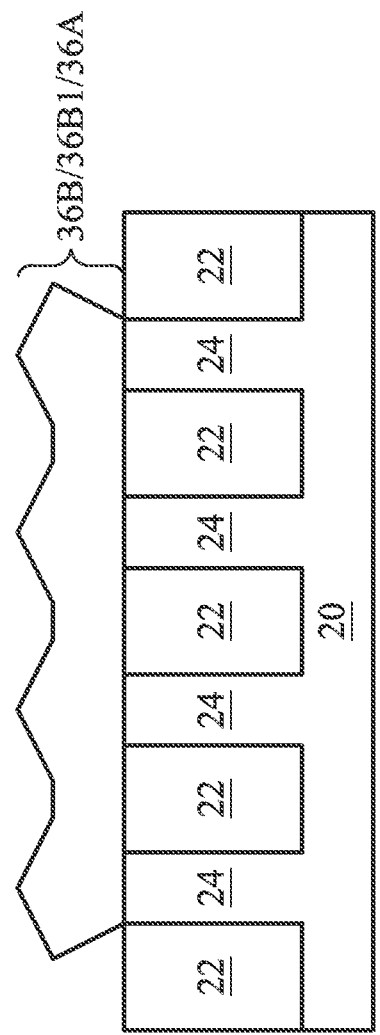
Figure 4D:
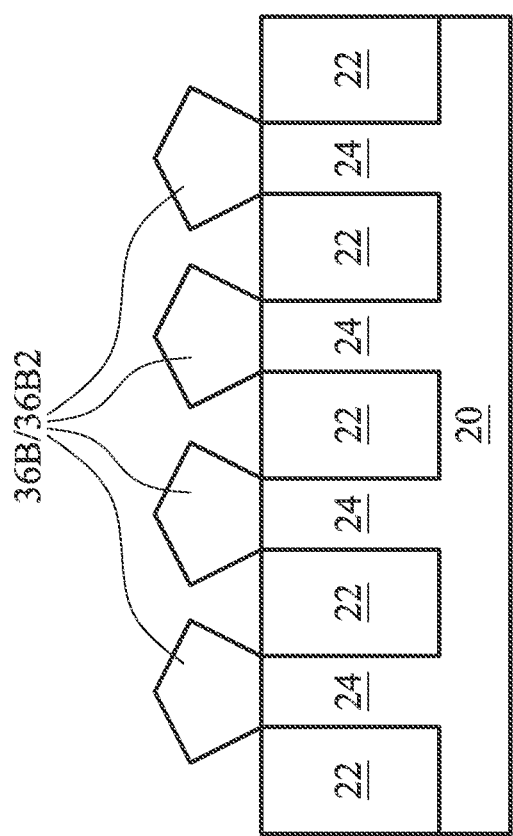

FIGS. 4C and 4D are cross-sectional views of the structure shown in FIG. 4A, wherein the cross-sectional views are obtained from the planes crossing lines 4C-4C and 4D-4D, respectively, in FIG. 4A. Referring to FIG. 4C, since the epitaxial growth includes vertical growth and horizontal growth, the portion of drain epitaxy region 36B grown from each of semiconductor fins/strips 24/26 eventually merges with the portions of drain epitaxy regions 36B grown from neighboring fins/strips 24/26. The merge occurs at the regions (for example, 36B1) close to gate stacks 30. Furthermore, the portions of source epitaxy region 36A grown from one of semiconductor fins/strips 24/26 merge with the portion of epitaxy region 36B grown from a neighboring fin/strip 24/26. The respective profile of source epitaxy region 36A is also similar to what is shown in FIG. 4C.

Referring to FIG. 4D, in the regions (for example, 36B2) close to the middle of gate stacks 30, the growth is slower, and drain epitaxy region 36B form individual strips 36B2 that do not merge with each other.

Figure 5A:
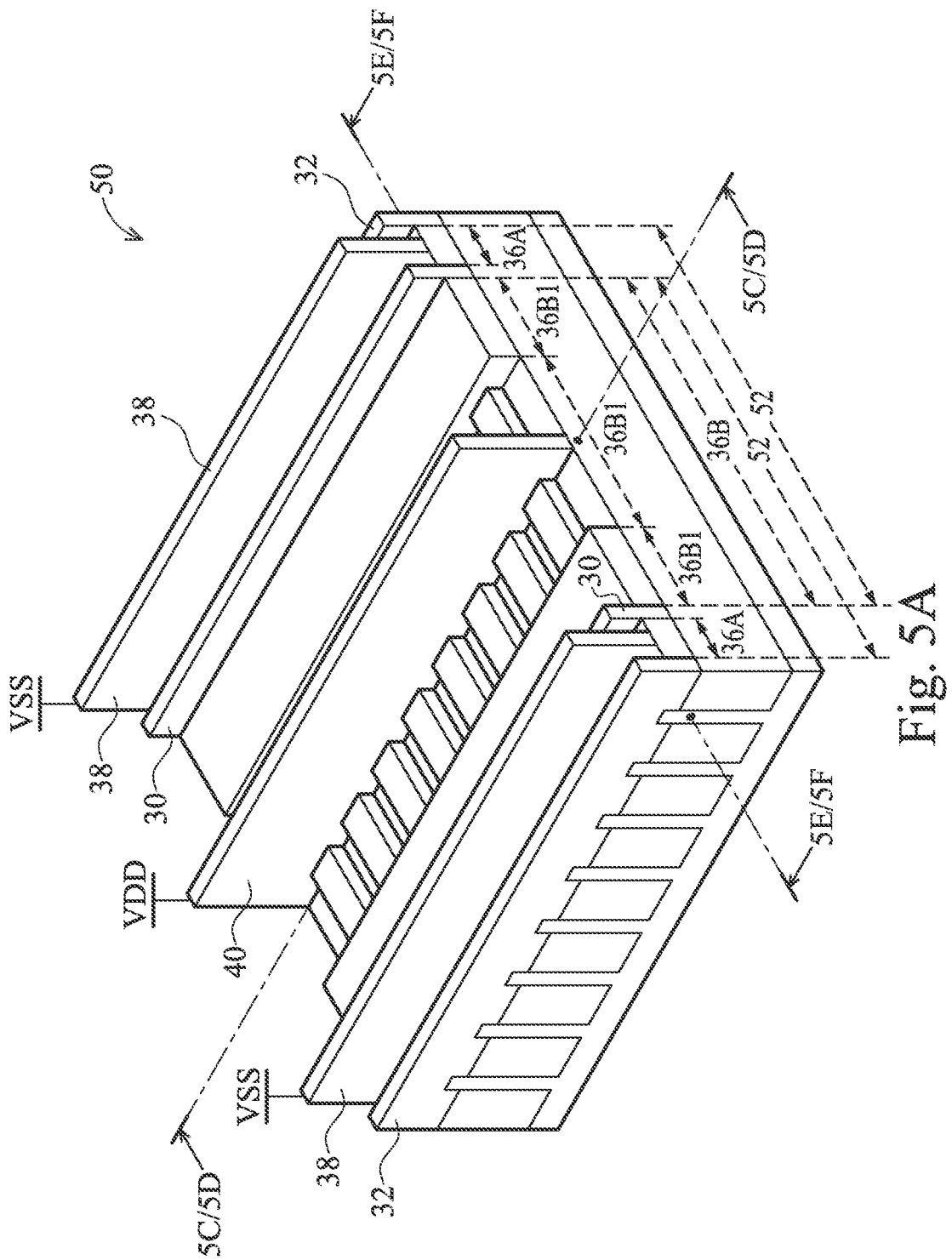

FIGS. 5A through 5F illustrate a perspective view, a top view, and cross-sectional views illustrating the formation of source contact plugs 38 and drain contact plug 40, and the underlying silicide regions 42 (not shown in FIG. 5A, please refer to FIGS. 5C through 5F). Referring to FIGS. 5A, source contact plugs 38 are formed over, and electrically coupled to, the respective underlying source epitaxy regions 36A. Drain contact plug 40 is formed over, and electrically coupled to, drain epitaxy regions 36B. Source contact plugs 38 and drain contact plug 40 may form strips that have lengthwise directions parallel to the lengthwise directions of gate stacks 30 and 32.

Figure 5B:
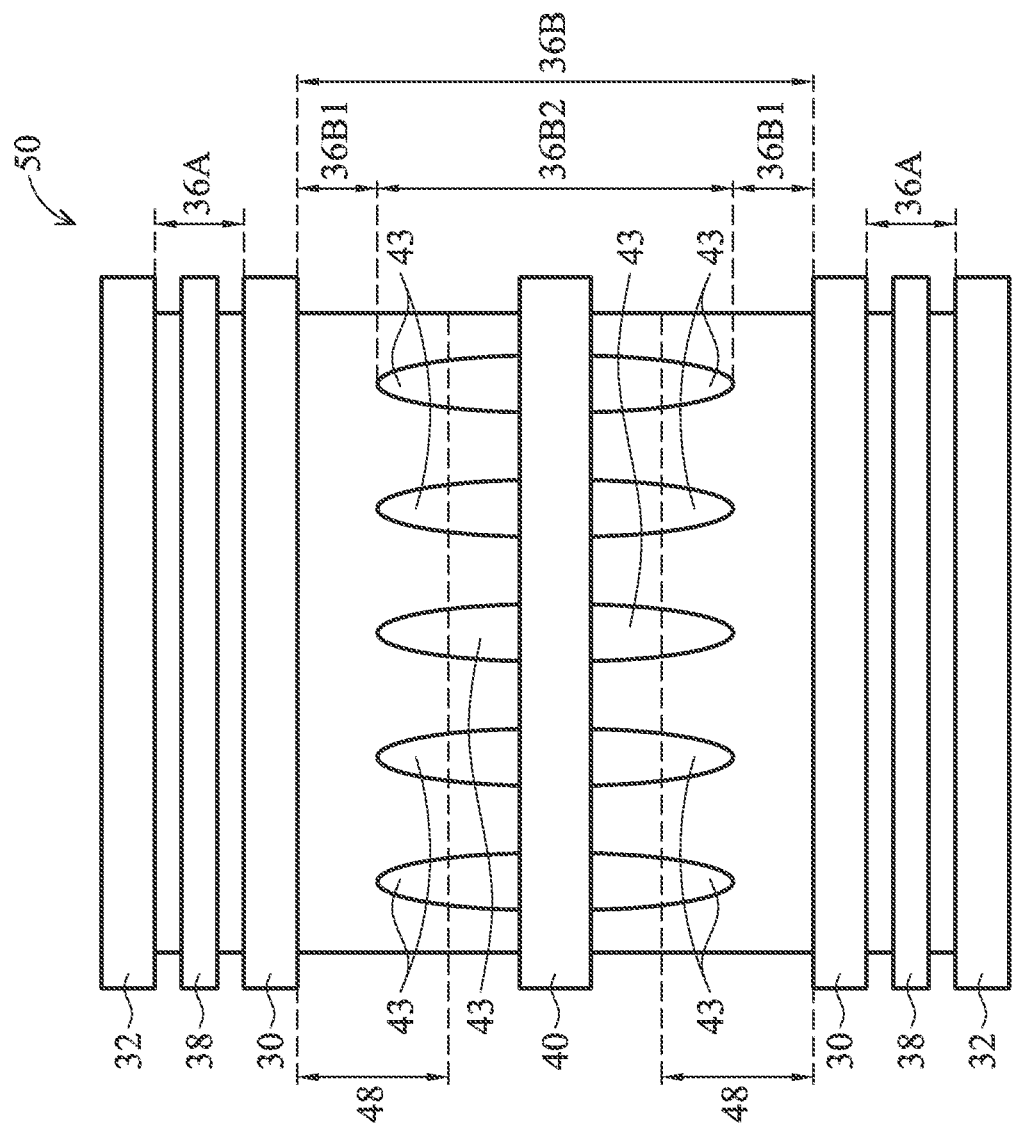

FIG. 5B illustrates a top view of the structure shown in FIG. 5A. In the top view, drain epitaxy region 36B2 includes a plurality of voids 43 therein. Voids 43 separate the portions 36B2 of epitaxy material 36 that grown from different semiconductor fins/strips 24/26 from each other. Some portions of voids 43 are filled with drain contact plug 40, and the remaining portions of voids 43 are filled with a dielectric material(s) in subsequent steps. Furthermore, drain contact plug 40 crosses the un-merged portions 36B2 of drain epitaxy region 36B. In some embodiments, drain contact plug 40 does not overlap the merged portions 36B1 of drain epitaxy region 36B. Voids 43 may extend to the opposite sides of drain contact plug 40.

Figure 5C:
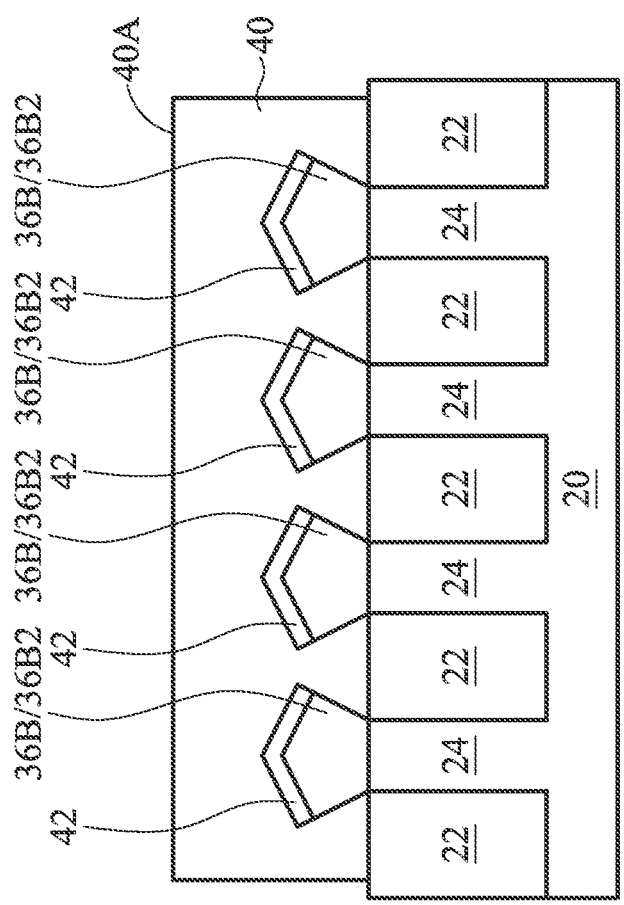
Figure 5D:
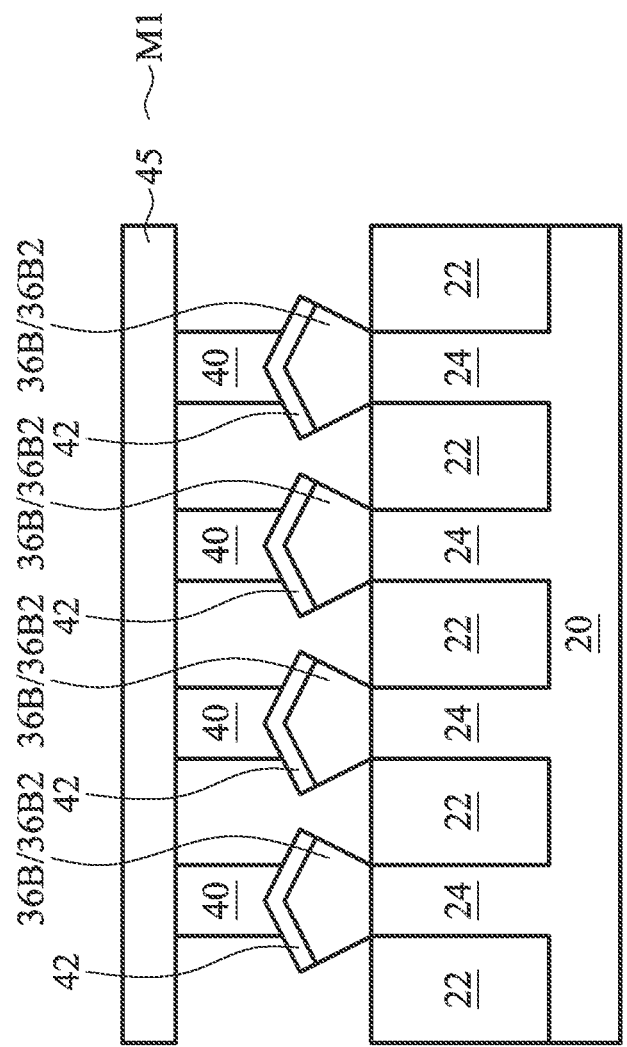

FIG. 5C illustrates a cross-sectional view of the structure shown in FIG. 5A, wherein the cross-sectional view is obtained from the plane crossing line 5C/5D-5C/5D in FIG. 5A. Silicide regions 42 are formed on the top surfaces of drain epitaxy region 36B. In some embodiments, drain contact plug 40 has top surface 40A substantially level with the top surface 35A of gate electrodes 35 (FIG. 4B). The respective drain contact plug 40 may sometimes be referred to as M0OD. In alternative embodiments, as shown in FIG. 5D, there may be a plurality of drain contact plugs 40, whose top surfaces are in contact with the bottom surface of metal line 45. Metal line 45 may be in bottom metal layer M1.

Figure 5E:
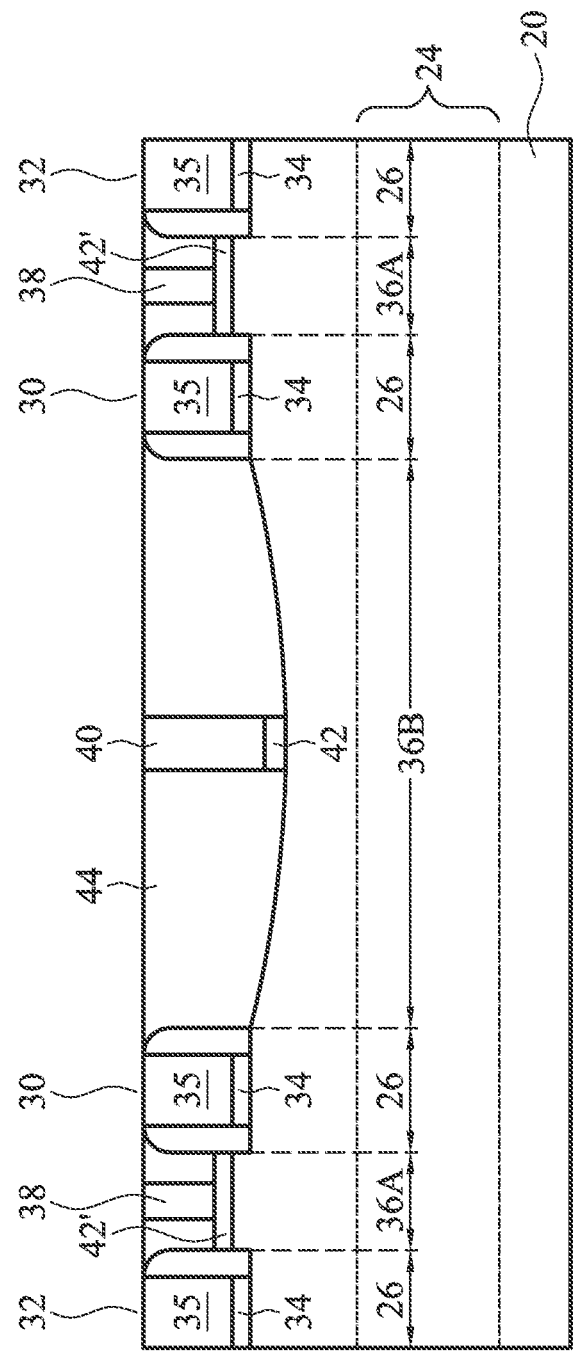
Figure 5F:
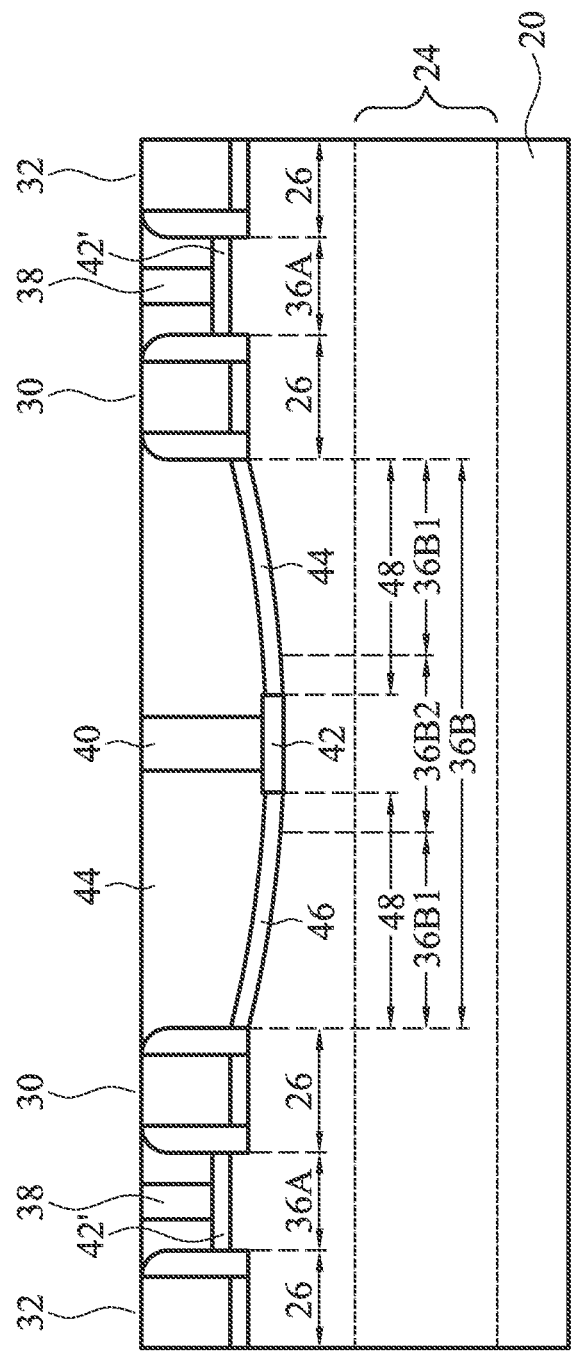

FIGS. 5E and 5F illustrate cross-sectional views of the structure shown in FIG. 5A, wherein the cross-sectional views are obtained from the plane crossing line 5E/5F-5E/5F in FIG. 5A. In some embodiments, as shown in FIG. 5E, the silicide-last approach is used to form silicide region 42. In the silicide-last approach, dielectric layer 44 is formed first. Silicide region 42 is formed by forming an opening in dielectric layer 44 to expose some portions of drain epitaxy region 36B, and performing a self-aligned silicidation on the exposed portions of drain epitaxy region 36B. Accordingly, silicide region 42 has edges aligned to the respective edges of drain contact plug 40. The other portions of drain epitaxy region 36B, however, may not have silicide regions formed thereon. This may help to increase the drain resistance, and the ESD devices in accordance with the embodiments may be turned on more uniformed.

In FIG. 5F, the silicide-first approach is used to form silicide region 42. In the silicide-first approach, Resistive Protective Oxide (RPO) 46 is formed, wherein RPO 46 at least covers some portions of unmerged drain epitaxy region 36B2. FIGS. 5B and 5F schematically illustrate regions 48, in which RPO is formed. As shown in FIG. 5F again, after the formation of RPO 46, silicide region 42 is formed where no RPO 46 is formed. In these embodiments, silicide region 42 may extend slightly beyond the respective edges of drain contact plug 40. In both FIGS. 5E and 5F, source silicide regions 42' are also formed at the same time drain silicide region 42 is formed. Source silicide regions 42' may be formed on entireties of source epitaxy regions 36A.

Referring back to FIG. 5A, the structure shown in FIGS. 5A through 5F form ESD device 50, which includes two FinFETs 52 that share common drain region 36B. Each of FinFETs 52 further includes source epitaxy regions 36A. In some embodiments, drain contact plug 40 is connected to an input/output (I/O) pad or power supply node VDD, and source contact plugs 38 are connected to power supply node VSS, which may be the electrical ground. In alternative embodiments, when FinFETs 52 are n-type FinFETs, drain contact plug 40 may be connected to an output pad of a circuit, source contact plugs 38 may be connected to power supply node VSS, and gate electrodes 35 (FIG. 4B) of gate stacks 30 may be connected to the internal circuit or VSS. Conversely, when FinFETs 52 are p-type FinFETs, drain contact plug 40 may be connected to an output pad of a circuit, source contact plugs 38 may be connected to power supply node VDD, and gate electrodes 35 of gate stacks 30 may be connected to the internal circuit or VDD. The electrodes 35 of gate stacks 32 may be electrically floating.

In the embodiments, by forming a non-merging drain epitaxy region, the drain resistance of ESD device 50 is increased. A plurality of ESD devices 50 may thus be turned on more uniformly. The embodiments require no additional process steps and lithography masks.

In accordance with embodiments, a device includes a plurality of STI regions, a plurality of semiconductor strips between the STI regions and parallel to each other, and a plurality of semiconductor fins over the semiconductor strips. A gate stack is disposed over and crossing the plurality of semiconductor fins. A drain epitaxy semiconductor region is disposed on a side of the gate stack and connected to the plurality of semiconductor fins. The drain epitaxy semiconductor region includes a first portion adjoining the plurality of semiconductor fins, wherein the first portion forms a continuous region over and aligned to the plurality of semiconductor strips. The drain epitaxy semiconductor region further includes second portions farther away from the gate stack than the first portion. Each of the second portions is over and aligned to one of the plurality of semiconductor strips. The second portions are parallel to each other, and are separated from each other by a dielectric material.

In accordance with other embodiments, a device includes a plurality of STI regions, a plurality of semiconductor strips between the plurality of STI regions and parallel to each other, and a plurality of semiconductor fins over the plurality semiconductor strips. A first gate stack and a second stack are disposed over and crossing the plurality of semiconductor fins. A drain epitaxy semiconductor region is between the first gate stack and the second gate stack. The drain epitaxy semiconductor region forms continuous drain regions in regions close to the first and the second gate stacks, and splits into a plurality of epitaxy strips in a region close to the middle of the first and the second gate stacks.

In accordance with yet other embodiments, a method includes performing an epitaxy to grow a plurality of epitaxy regions from a plurality of semiconductor strips that are between a plurality of STI regions. The epitaxy is continued, so that first portions of the plurality of epitaxy regions close to a gate stack are merged into a continuous drain epitaxy region, and second portions of the plurality of epitaxy regions farther away from the gate stack than the first portions are separate from each other. When the second portions of the plurality of epitaxy regions are separate from each other, a contact plug is formed to electrically connect to the second portions of the plurality of epitaxy regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a plurality of Shallow Trench Isolation (STI) regions;
   a plurality of semiconductor strips between the plurality of STI regions and parallel to each other;
   a plurality of semiconductor fins over the plurality semiconductor strips;
   a gate stack over and crossing the plurality of semiconductor fins; and
   a drain epitaxy semiconductor region on a side of the gate stack and connected to the plurality of semiconductor fins, wherein the drain epitaxy semiconductor region comprises:
      a first portion adjoining the plurality of semiconductor fins, wherein the first portion forms a continuous region over and aligned to the plurality of semiconductor strips; and
      second portions farther away from the gate stack than the first portion, wherein each of the second portions is over and aligned to one of the plurality of semiconductor strips, and wherein the second portions are parallel to each other, and are separated from each other by a dielectric material.

2. The device of claim 1 further comprising a source epitaxy semiconductor region, wherein the drain epitaxy semiconductor region and the source epitaxy semiconductor region are on opposite sides of the gate stack, and wherein the source epitaxy semiconductor region is a continuous region overlying and aligned to the plurality semiconductor strips.

3. The device of claim 1 further comprising a drain contact plug over and electrically connected to the second portions of the drain epitaxy semiconductor region.

4. The device of claim 3, wherein the second portions of the drain epitaxy semiconductor region have voids there between, and wherein the voids are formed on opposite sides of the drain contact plug.

5. The device of claim 1, wherein top surfaces of the second portions are lower than a top surface of the first portion of the drain epitaxy semiconductor region.

6. The device of claim 1, wherein the gate stack and the drain epitaxy semiconductor region form a Fin Field-Effect Transistor (FinFET), and wherein the FinFET is comprised in an ElectroStatic Discharge (ESD) device.

7. The device of claim 6, wherein the drain epitaxy semiconductor region is connected to an input/output pad, and a source of the FinFET is connected to VSS.

8. A device comprising:
   a plurality of Shallow Trench Isolation (STI) regions;
   a plurality of semiconductor strips between the plurality of STI regions and parallel to each other;
   a plurality of semiconductor fins over the plurality semiconductor strips;
   a first gate stack and a second stack over and crossing the plurality of semiconductor fins; and
   a drain epitaxy semiconductor region between the first gate stack and the second gate stack, wherein the drain epitaxy semiconductor region forms continuous drain regions in regions close to the first and the second gate stacks, and splits into a plurality of epitaxy strips in a region close to a middle portion of the first and the second gate stacks.

9. The device of claim 8 further comprising:
a first source epitaxy region, wherein the first source epitaxy region and the drain epitaxy semiconductor region are on opposite sides of the first gate stack; and
a second source epitaxy region, wherein the second source epitaxy region and the drain epitaxy semiconductor region are on opposite sides of the second gate stack, and wherein each of the first and the second source epitaxy regions is a continuous region over and aligned to the plurality of semiconductor strips.

10. The device of claim 9, wherein the drain epitaxy semiconductor region is connected to an input/output pad or VDD, and wherein the first and the second source epitaxy regions are connected to VSS.

11. The device of claim 8 further comprising a drain contact plug overlapping and electrically coupled to the plurality of epitaxy strips of the drain epitaxy semiconductor region, wherein the drain contact plug does not overlap the continuous drain regions of the drain epitaxy semiconductor region.

12. The device of claim 8 further comprising a dielectric material separating the plurality of epitaxy strips of the drain epitaxy semiconductor region from each other.

13. The device of claim 8, wherein top surfaces of the plurality of epitaxy strips are lower than top surfaces of the continuous drain regions.

14. A method comprising:
performing an epitaxy to grow a plurality of epitaxy regions from a plurality of semiconductor strips that are between a plurality of Shallow Trench Isolation (STI) regions;
continuing the epitaxy, wherein first portions of the plurality of epitaxy regions close to a gate stack are merged into a continuous drain epitaxy region, and wherein second portions of the plurality of epitaxy regions farther away from the gate stack than the first portions are separate from each other; and
when the second portions of the plurality of epitaxy regions are separate from each other, forming a contact plug to electrically connect to the second portions of the plurality of epitaxy regions.

15. The method of claim 14, wherein the contact plug does not overlap the continuous drain epitaxy region.

16. The method of claim 14 further comprising:
forming the gate stack over and crossing a plurality of semiconductor fins, wherein each of the plurality of semiconductor fins is over and aligned to one of the plurality of semiconductor strips; and
etching portions of the plurality of semiconductor fins not covered by the gate stack, wherein the plurality of semiconductor strips is exposed, and wherein the plurality of epitaxy regions is grown from exposed portions of the plurality of semiconductor strips.

17. The method of claim 14 further comprising forming a silicide region over the second portions of the plurality of epitaxy regions, wherein the continuous drain epitaxy region and parts of the second portions of the plurality of epitaxy regions are not covered by the silicide region.

18. The method of claim 17 further comprising:
forming a Resist protective Oxide (RPO) over and contacting the continuous drain epitaxy region and parts of the second portions of the plurality of epitaxy regions; and
after the step of forming the RPO, forming the silicide region on exposed portions of the second portions of the plurality of epitaxy regions.

19. The method of claim 14, wherein during the step of performing the epitaxy and the step of continuing the epitaxy, a source epitaxy region is formed, wherein the source epitaxy region and the continuous drain epitaxy region are on opposite sides of the gate stack, and wherein the source epitaxy region is a continuous semiconductor region overlapping the plurality of semiconductor strips.

20. The method of claim 19 further comprising connecting the contact plug to an input/output pad, and connecting the source epitaxy region to a VSS power supply.

* * * * *